United States Patent
Zhao (10) Patent No.: US 11,825,701 B2
(45) Date of Patent: Nov. 21, 2023

(54) DISPLAY PANEL AND MANUFACTURING METHOD THEREOF

(71) Applicant: Wuhan China Star Optoelectronics Semiconductor Display Technology Co., Ltd., Hubei (CN)

(72) Inventor: Huihui Zhao, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 445 days.

(21) Appl. No.: 17/057,710

(22) PCT Filed: Jun. 23, 2020

(86) PCT No.: PCT/CN2020/097806
§ 371 (c)(1),
(2) Date: Nov. 23, 2020

(87) PCT Pub. No.: WO2021/217840
PCT Pub. Date: Nov. 4, 2021

(65) Prior Publication Data
US 2022/0140031 A1      May 5, 2022

(30) Foreign Application Priority Data
Apr. 26, 2020   (CN) .......................... 202010339873.0

(51) Int. Cl.
*H10K 59/124*   (2023.01)
*H10K 71/00*    (2023.01)
(Continued)

(52) U.S. Cl.
CPC ........... *H10K 59/124* (2023.02); *H10K 71/00* (2023.02); *H10K 77/111* (2023.02); *H10K 59/1201* (2023.02); *H10K 2102/311* (2023.02)

(58) Field of Classification Search
CPC .... H10K 59/124; H10K 71/00; H10K 77/111; H10K 59/1201; H10K 2102/311;
(Continued)

(56) References Cited

U.S. PATENT DOCUMENTS

| 2019/0131566 A1* | 5/2019 | Jiang | ................. G02F 1/134336 |
| 2020/0027903 A1* | 1/2020 | Tian  | ..................... H10K 59/131 |

(Continued)

FOREIGN PATENT DOCUMENTS

| CN | 108288637 | 7/2018 |
| CN | 109300917 | 2/2019 |

(Continued)

OTHER PUBLICATIONS

Definition of Penetrate downloaded from URL<https://www.merriam-webster.com/dictionary/penetrate> on Apr. 3, 2023. (Year: 2023).*

*Primary Examiner* — J. E. Schoenholtz (57) ABSTRACT

A display panel and a manufacturing method thereof are provided. The display panel includes a substrate, a barrier layer, a buffer layer, and a thin-film transistor (TFT) array layer. A plurality of first through-holes arranged apart from each other are defined in a display area, a plurality of second through-holes are defined in a bonding area, and the first through-holes and the second through-holes penetrate from an insulating layer to a side of the substrate near the barrier layer. The first through-holes and the second through-holes are filled with a flexible material, thereby improving bending resistance capability of the display panel, and reducing risks of cracking.

14 Claims, 4 Drawing Sheets

(51) Int. Cl.
*H10K 77/10* (2023.01)
*H10K 59/12* (2023.01)
*H10K 102/00* (2023.01)

(58) Field of Classification Search
CPC ..... H10K 59/12; Y02E 10/549; H01L 27/124; H01L 27/127; H01L 27/1288
See application file for complete search history.

(56) References Cited

U.S. PATENT DOCUMENTS

| | | | |
|---|---|---|---|
| 2020/0105789 | A1 | 4/2020 | Fang et al. |
| 2020/0185423 | A1 | 6/2020 | Hu |
| 2021/0048851 | A1* | 2/2021 | Zheng ................... G02B 1/14 |
| 2021/0225893 | A1* | 7/2021 | Yang ................... H01L 27/1237 |
| 2022/0255025 | A1* | 8/2022 | Yang ................... H10K 77/111 |

FOREIGN PATENT DOCUMENTS

| | | |
|---|---|---|
| CN | 109494313 | 3/2019 |
| CN | 109671719 | 4/2019 |
| CN | 110690226 | 1/2020 |
| CN | 111063697 | 4/2020 |

* cited by examiner

DISPLAY PANEL AND MANUFACTURING METHOD THEREOF

RELATED APPLICATIONS

This application is a National Phase of PCT Patent Application No. PCT/CN2020/097806 having International filing date of Jun. 23, 2020, which claims the benefit of priority of Chinese Patent Application No. 202010339873.0 filed on Apr. 26, 2020. The contents of the above applications are all incorporated by reference as if fully set forth herein in their entirety.

FIELD AND BACKGROUND OF THE INVENTION

The present disclosure relates to the field of display technologies, and more particularly, relates to a display panel and a manufacturing method thereof.

Flexible display devices, which are formed based on a flexible base material, have very promising prospect and huge market potential in fields of portable products and display applications due to characteristics such as rollability, wide viewing angles, and portability.

Technical problems are described below.

Manufacturing processes of organic light-emitting diode (OLED) display panels are complex and require many mask plates, resulting in low production yield rate and high costs. Conventional flexible OLED display panels are manufactured by at least twelve mask processes. A through-hole connecting a source/drain electrode to a source layer and a through-hole configured to release applied forces are respectively manufactured by a mask process, complicating manufacturing processes and increasing costs. Furthermore, undesirable products may be manufactured during every process, contributing to low production yield rate of display panels. In addition, the display panels are provided with an inorganic material layer with a certain thickness and poor flexibility, which increases risks of cracking when flexible display panels are folded.

In summary, the conventional display panels have following problems: complicated manufacturing processes of through-holes, high costs, and low production yield rate. Therefore, it is necessary to provide a display panel and a manufacturing method thereof to address the above issue.

SUMMARY OF THE INVENTION

An embodiment of the present disclosure provides a display panel and a manufacturing method thereof to solve following problems: conventional display panels have complicated manufacturing processes of through-holes, high costs, and low production yield rate.

An embodiment of the present disclosure provides a display panel, comprising a display area and a non-display area surrounding the display area, wherein the non-display area comprises a bonding area, and the display panel further comprises:

a substrate;
a barrier layer disposed on the substrate;
a buffer layer disposed on a side of the barrier layer away from the substrate;
a thin-film transistor (TFT) array layer disposed on a side of the buffer layer away from the substrate, wherein the TFT array layer comprises a plurality of TFTs and at least two insulating layers which are stacked and configured to separate a plurality of devices in the TFTs from each other; and
a display device layer disposed on a side of the TFT array layer away from the substrate;
wherein a plurality of first through-holes arranged apart from each other are defined in the display area, a plurality of second through-holes arranged apart from each other are defined in the bonding area, the first through-holes and the second through-holes pass through the substrate from the insulating layer to a side of the substrate near the barrier layer, and the first through-holes and the second through-holes are filled with a flexible material.

According to one embodiment of the present disclosure, each of the second through-holes comprises a first area and a second area, a bottom surface of the second area is in contact with the side of the substrate near the barrier layer, and the first area and the second area are connected to each other at a side of the buffer layer away from the substrate.

According to one embodiment of the present disclosure, each of the first through-holes comprises a first part and a second part, the first part and the first area of the second through-holes are defined on a same layer, and the second part and the second area of the second through-holes are defined on a same layer.

According to one embodiment of the present disclosure, a diameter of the first part is greater than a diameter of the second part.

According to one embodiment of the present disclosure, the diameter of the first part and the diameter of the second part are progressively decreased along a direction from the insulating layer to the substrate.

According to one embodiment of the present disclosure, an angle between a side wall of each of the first through-holes and a first direction and an angle between a side wall of each of the second through-holes and the first direction range from 40° to 80°.

An embodiment of the present disclosure further provides a display panel, comprising a display area and a non-display area surrounding the display area, wherein the non-display area comprises a bonding area, and the display panel further comprises:

a substrate;
a driving circuit layer disposed on the substrate;
a buffer layer disposed on a side of the barrier layer away from the substrate;
a thin-film transistor (TFT) array layer disposed on a side of the buffer layer away from the substrate, wherein the TFT array layer comprises a plurality of TFTs and at least two insulating layers which are stacked and configured to separate a plurality of devices in the TFTs from each other; and
a display device layer disposed on a side of the TFT array layer away from the substrate;
wherein a plurality of first through-holes arranged apart from each other are defined in the display area, a plurality of second through-holes arranged apart from each other are defined in the bonding area, the first through-holes and the second through-holes pass through the substrate from the insulating layer to a side of the substrate near the barrier layer, each of the second through-holes comprises a first area and a second area, a bottom surface of the second area is in contact with the side of the substrate near the barrier layer, the first area and the second area are connected to each other at the side of the buffer layer away from the substrate, each of the first through-holes comprises a first part defined on a same layer as the first area and a second part defined on a same layer as the second area, and the first through-holes and the second through-holes are filled with a flexible material.

According to one embodiment of the present disclosure, a diameter of the first part is greater than a diameter of the second part.

According to one embodiment of the present disclosure, the diameter of the first part and the diameter of the second part are progressively decreased along a direction from the insulating layer to the substrate.

According to one embodiment of the present disclosure, an angle between a side wall of each of the first through-holes and a first direction and an angle between a side wall of each of the second through-holes and the first direction range from 40° to 80°.

An embodiment of the present disclosure further provides a method of manufacturing a display panel, comprising following steps:

providing a substrate, and forming a barrier layer, a buffer layer, an active layer, a gate insulating layer, a gate line layer, and an interlayer insulating layer on the substrate;

etching the interlayer insulating layer and the gate insulating layer to form a plurality of first parts of a plurality of first through-holes and a plurality of first areas of a plurality of second through-holes with a first mask plate, wherein the first parts and the first areas pass through the interlayer insulating layer and the gate insulating layer;

etching the first parts and the first areas to form a plurality of second parts of the first through-holes and a plurality of second areas of the second through-holes with a second mask plate, wherein the second parts and the second areas pass through the buffer layer and the barrier layer; and forming a flexible layer on a surface of the interlayer insulating layer, and filling a flexible material in the first through-holes and the second through-holes;

wherein the substrate comprises a display area and a non-display area surrounding the display area, the non-display area comprises a bonding area, the first through-holes are arranged apart from each other in the display area, and the second through-holes area arranged apart from each other in the bonding area.

According to one embodiment of the present disclosure, when the first parts and the first areas are formed by etching with the first mask plate, a plurality of third through-holes passing through the interlayer insulating layer and the gate insulating layer are formed to expose a portion of the active layer.

According to one embodiment of the present disclosure, a diameter of the first parts is greater than a diameter of the second parts.

According to one embodiment of the present disclosure, an angle between a side wall of each of the first parts and a first direction and an angle between a side wall of each of the second parts and the first direction range from 40° to 80°.

Regarding the beneficial effects: an embodiment of the present disclosure provides a display panel. In the display panel, a plurality of first through-holes arranged apart from each other are defined in a display area, a plurality of second through-holes arranged apart from each other are defined in a bonding area, and the first through-holes and the second through-holes penetrate from an insulating layer to a side of the substrate near a barrier layer. Thus, the second through-holes and the first through-holes can be formed in a single process, thereby omitting manufacturing processes of the first through-holes, saving a mask plate for manufacturing the first through-holes, and reducing manufacturing costs. Moreover, due to the first through-holes, a portion of an inorganic insulating material of a buffer layer and a portion of an inorganic insulating material of the barrier layer can be omitted. A flexible material is filled in the first through-holes, thereby improving bending resistance capability of the display panel and reducing risks of cracking.

BRIEF DESCRIPTION OF THE SEVERAL VIEWS OF THE DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DESCRIPTION OF SPECIFIC EMBODIMENTS OF THE INVENTION

The following description of the various embodiments is provided with reference to the accompanying drawings. The embodiments described with reference to the attached drawings are all exemplary and are intended to illustrate and interpret the present disclosure. It should be understood that terms such as "top", "bottom", "front", "rear", "left", "right", "inside", "outside", "lateral", as well as derivatives thereof should be construed to refer to the orientation as then described or as shown in the drawings under discussion. These relative terms are for convenience of description, and shall not be construed as causing limitations to the present disclosure. In the drawings, the identical or similar reference numerals constantly denote the identical or similar elements or elements having the identical or similar functions.

The present disclosure is further described below in conjunction with accompanying drawings and specific embodiments.

Figure 1:
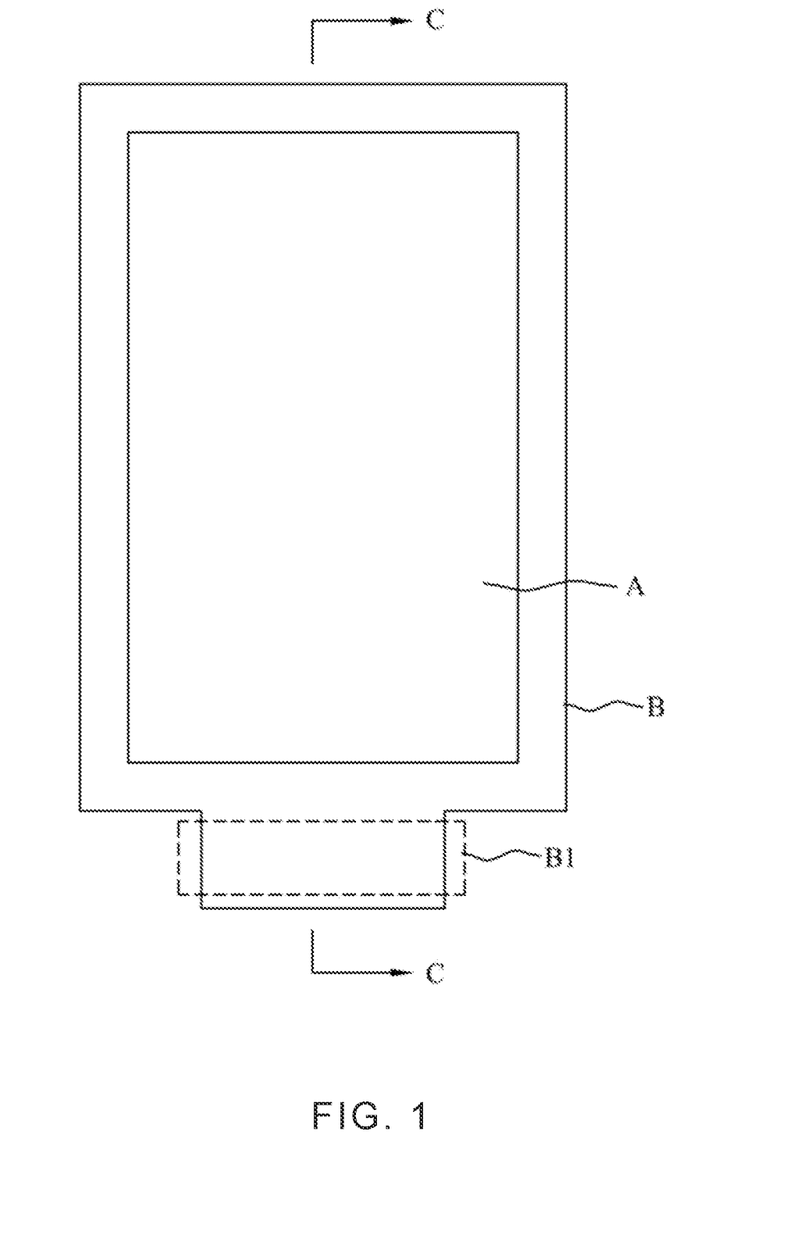
FIG. 1 is a plan structural schematic view showing a display panel provided by an embodiment of the present disclosure.

The present embodiment provides a display panel, which is illustrated in detail below in conjunction with FIG. 1. As shown in FIG. 1, a plan structural schematic view showing the display panel provided the present embodiment is provided. The display panel includes a display area A and a non-display area B surrounding the display area A. The non-display area B includes a bonding area B1 which can be bent toward a backside of the display panel, thereby reducing a width of outer frames of the display panel, and increasing a screen-to-body ratio.

Figure 2:
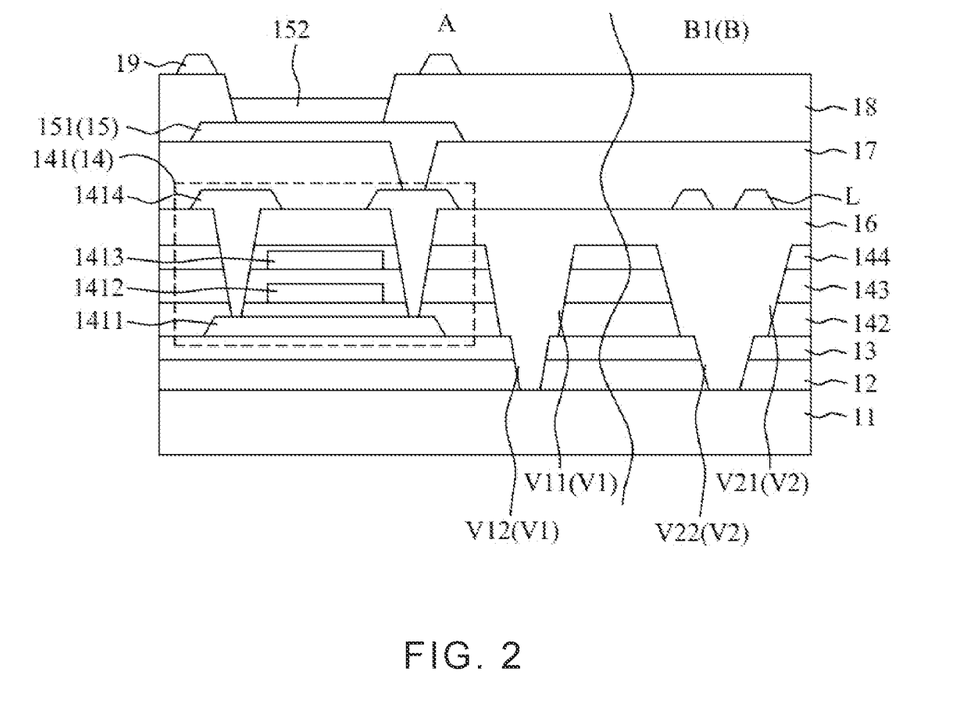
FIG. 2 is a sectional structural schematic view showing the display panel provided by the embodiment of the present disclosure taken along a C-C direction in FIG. 1.

As shown in FIG. 2, a sectional structural schematic view showing the display panel taken along a C-C direction in FIG. 1 is provided. The display panel includes a substrate 11, a barrier layer 12 disposed on the substrate 11, a buffer layer 13 disposed on a side of the barrier layer 12 away from the substrate 11, a thin-film transistor (TFT) array layer 14 disposed on a side of the buffer layer 13 away from the substrate 11, and a display device layer 15 disposed on a side of the TFT array layer 14 away from the substrate 11.

In the present embodiment, a material of the barrier layer 12 includes one or more of silicon oxide, silicon nitride, silicon oxynitride, and amorphous silicon, and is mainly configured to block moisture and oxygen, thereby preventing erosion of the display panel caused by moisture or oxygen. A material of the buffer layer 13 includes silicon nitride, silicon oxygen, or a combination thereof, and is mainly configured to provide buffering effect and protect the display panel.

Specifically, the TFT array layer 14 includes a plurality of TFTs 141. In the present embodiment, the TFTs 141 are dual-gate TFTs and each includes an active layer 1411, a first gate line layer 1412, a second gate line layer 1413, and a source/drain electrode layer 1414. The TFT array layer 14 further includes a first gate insulating layer 142 disposed on a side of the buffer layer 13 away from the substrate 11, and a second gate insulating layer 143 and an interlayer insulating layer 144 which are stacked on the first gate insulating layer 142. A flexible layer 16 is disposed between the source/drain electrode layer 1414 and the interlayer insulating layer 144.

The source/drain electrode layer 1414 is electrically connected to the active layer 1411 by a through-hole passing through the flexible layer 16, the interlayer insulating layer 144, the second gate insulating layer 143, and the first gate insulating layer 142. Of course, in some embodiments, the TFTs 141 may also be a TFT only including one gate line layer. In addition, the TFTs 141 may also be top-gate TFTs or bottom-gate TFTs, both of them can be used in the present embodiment, and a structure of the TFTs 141 is not limited to the present embodiment.

As shown in FIG. 1, a planarization layer 17 is disposed on a side of the flexible layer 16 away from the substrate 11. The display device layer 15 is disposed on the planarization layer 17 and includes an anode 151, a luminescent layer 152, and a cathode (not shown). The anode 151 is connected to the source/drain electrode layer 1414 by a through-hole passing through the planarization layer 17. A pixel defining layer 18 is further disposed on the planarization layer 17 and covers the anode 151. In addition, the pixel defining layer 18 is provided with a recess exposing a portion of the anode 151, and the luminescent layer 152 is disposed in the recess. A plurality of spacers 19 arranged apart from each other are disposed on a side of the pixel defining layer 18 away from the substrate 11.

In the present embodiment, a plurality of first through-holes V1 arranged apart from each other are defined in the display area A, a plurality of second through-holes V2 arranged apart from each other are defined in the display area B, and the first through-holes V1 and the second through-holes V2 penetrate from the interlayer insulating layer 144 to a side of the substrate 11 near the barrier layer 12. Furthermore, along a direction perpendicular to a thickness direction of the display panel, a height of the first through-holes V1 and a height of the second through-holes V2 are same. The first through-holes V1 and the second through-holes V2 expose a portion of the substrate 11. Therefore, a portion of an inorganic insulating material of the buffer layer 13 and a portion of an inorganic insulating material of the barrier layer 12 can be omitted, and bending resistance property of the display panel can be improved. Moreover, the first through-holes V1 and the second through-holes V2 are filled with a flexible material of the flexible layer 16. The first through-holes V1 are configured to release applied forces generated when the display area A is bent, thereby reducing risks of cracking when the display area is bent. The second through-holes V2 are configured to release applied forces generated when the bonding area B1 is bent, thereby preventing breakage of multiple data lines L disposed on the bonding area B1.

Specifically, each of the second through-holes V2 includes a first area V21 and a second area V22. The first area V21 passes through the interlayer insulating layer 144, the second gate insulating layer 143, and the first gate insulating layer 142. The second area V22 passes through the buffer layer 13 and the barrier layer 12. A bottom surface of the second area V22 is in contact with the side of the substrate 11 near the barrier layer 12. The first area V21 and the second area V22 are connected to each other at the side of the buffer layer 13 away from the substrate 11. When the second through-holes V2 are formed, both the first area V21 and the second area V22 need to be formed by two etching processes with two mask plates because they are defined on different layers and have different diameters.

Each of the first through-holes V2 also includes a first part V11 and a second part V22. The first part V11 and the first area V21 of the second through-holes V2 are defined on a same layer. That is, the first part V11 penetrates the interlayer insulating layer 144, the second gate insulating layer 143, and the first gate insulating layer 142. Furthermore, along the thickness direction of the display panel, a height of first part V11 and a height of the first area V21 are same. The second part V12 and the second area 12 of the second through-hole V2 are defined on a same layer. That is, the second part V12 passes through the buffer layer 13 and the barrier layer 12. As a result, a portion of an inorganic layer of the barrier layer 12 and a portion of an inorganic layer of the buffer layer 13 be omitted due to the second part V12, thereby improving bending resistance capability of the display panel. Moreover, because the second through-holes V2 and the first through-holes V1 can be simultaneously formed during manufacturing processes of the second through-holes V2, manufacturing processes of the first through-holes V1 can be omitted, and a mask plate for manufacturing the first through-holes V1 can be saved. Therefore, a production yield rate is increased and production costs are reduced.

Furthermore, a diameter of the first part V11 of the first through-holes V1 is greater than a diameter of the second part V12 of the first through-holes V1. A step-shaped buffer angle is formed at the buffer layer where the first part V11 and the second part V12 are connected, thereby reducing slope of the first through-holes V1 and decreasing applied forces generated when the display area A is bent.

Furthermore, the diameter of the first part V11 of the first through-holes and the diameter of the second part V12 of the first through-holes V1 are progressively decreased along a direction from the interlayer insulating layer 144 to the substrate 11. That is, a schematic structural view of the first part V11 and a schematic structural view of the second part V12 is inverted trapezoidal, as shown in FIG. 1. An angle between a side wall of the first part V11 and a first direction and an angle between a side wall of the second part V12 and the first direction are an acute angle. Wherein, the first direction is a horizontal direction perpendicular to the thickness direction of the display panel.

Preferably, the angle between the side wall of the first part V11 and the first direction and the angle between the side wall of the second part V12 and the first direction range from 40° to 80°. If the angle is too wide, the slope of the first through-holes V1 will to be too steep, which is not beneficial for reducing applied forces generated when the display area is bent. On the other hand, if the angle is too narrow, an opening area of the first through-holes V1 will be too large, which is not beneficial for increasing an opening area of pixels. In addition, features of the first area V21 and second area V22 of the second through-holes V2 and those of the first through-holes V1 are same, and are not described here again.

Regarding the beneficial effects: the present embodiment provides the display panel. In the display panel, the plurality of first through-holes arranged apart from each other are defined in the display area, the plurality of second through-holes arranged apart from each other are defined in the bonding area, and the first through-holes and the second through-holes penetrate from the insulating layer to the side of the substrate near the barrier layer. Thus, the second through-holes and the first through-holes can be formed in a single process, thereby reducing processes of manufacturing the first through-holes, saving a mask plate for manufacturing the first through-holes, and reducing manufacturing costs. Moreover, by filling the flexible material in the first through-holes, a portion of the inorganic insulating material of the buffer layer 13 and a portion of the inorganic insulating material of the barrier layer 12 can be omitted, thereby improving bending resistance capability of the display panel and reducing risks of cracking.

Figure 3A:
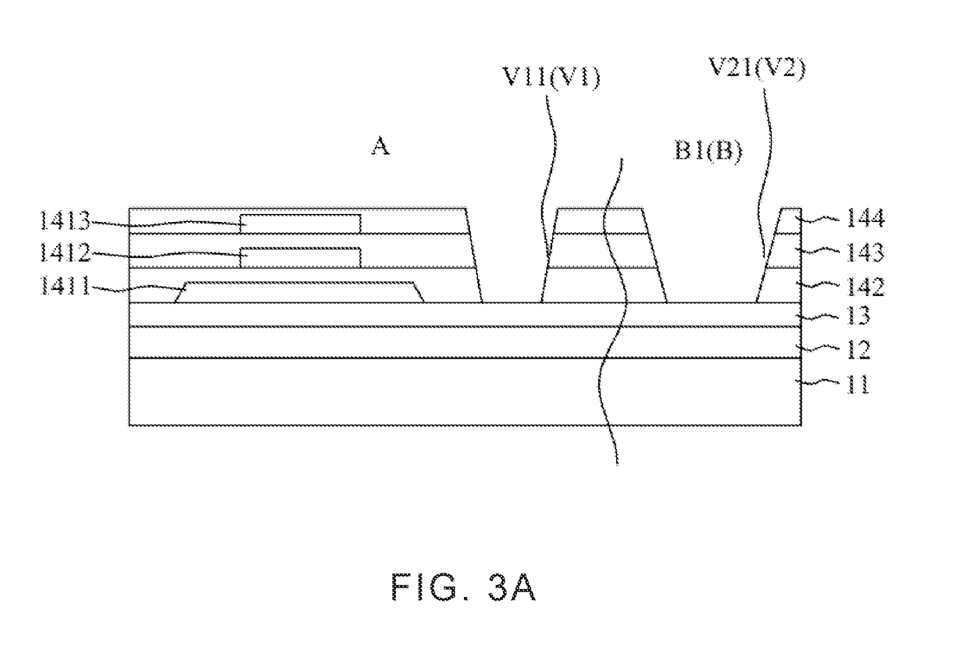
FIGS. 3A, 3B and 3C are sectional structural schematic views showing the display panel manufactured by a manufacturing method provided by an embodiment of the present disclosure taken along the C-C direction in FIG. 1.
Figure 3B:
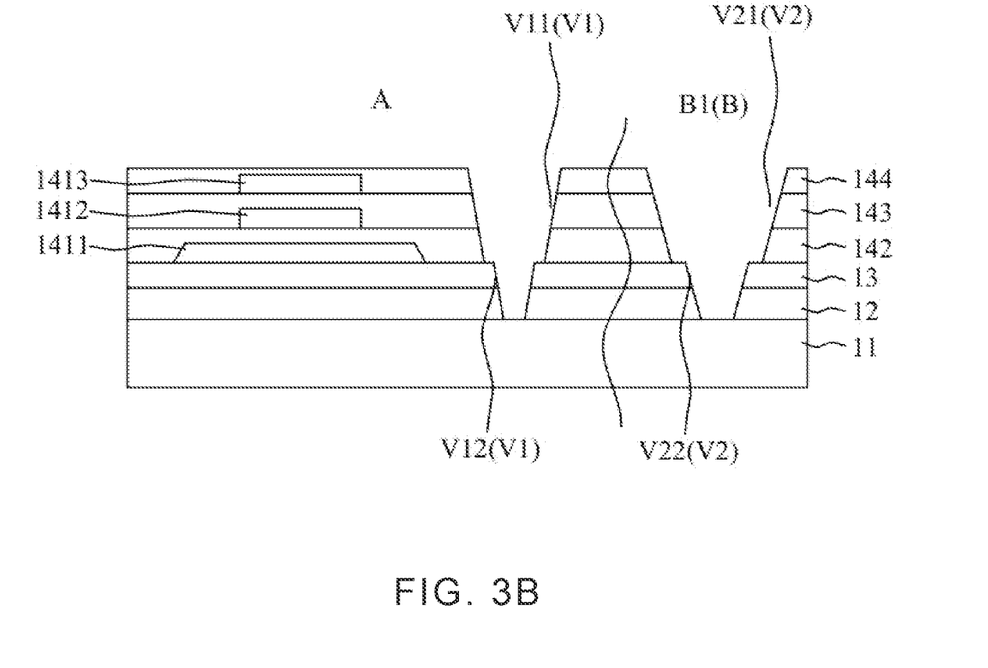
Figure 3C:
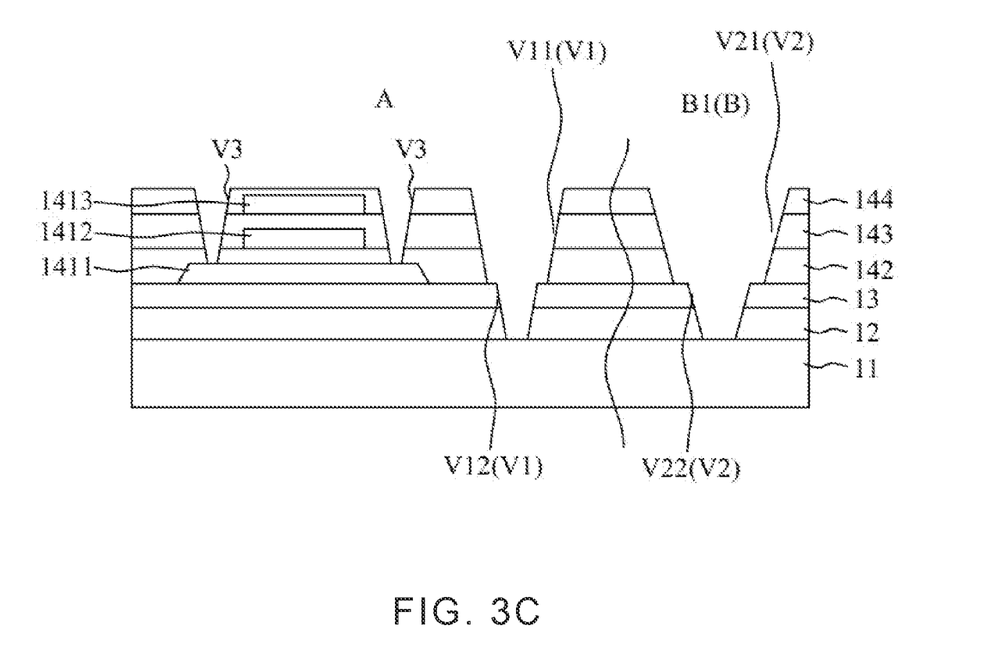

An embodiment of the present disclosure further provides a method of manufacturing a display panel which is described in detail below in conjunction with FIGS. 1 to 3C. FIGS. 3A to 3C are sectional structural schematic views showing the display panel manufactured by the manufacturing method provided by the present embodiment taken along the C-C direction in FIG. 1. The manufacturing method includes following steps:

Step S1: providing a substrate 11, and forming a barrier layer 12, a buffer layer 13, an active layer 1411, a first gate insulating layer 142, a first gate line layer 1412, a second gate insulating layer 143, a second gate line layer 1413, and an interlayer insulating layer 144 on the substrate 11;

Step S2: forming a plurality of first parts V11 of a plurality of first through-holes V1 and a plurality of first areas V21 of a plurality of second through-holes V2 by etching with a first mask plate, wherein the first parts V11 and the first areas V21 pass through the interlayer insulating layer 144, the first gate insulating layer 143, and the second gate insulating layer 142, as shown in FIG. 3A;

Step S3: forming a plurality of second parts V12 of the first through-holes V1 on the first parts V11 and a plurality of second areas V22 of the second through-holes V2 on the first areas V21 by etching with a second mask plate, wherein the second parts V12 and the second areas V22 pass through the buffer layer 13 and the barrier layer 12, as shown in FIG. 3B;

Step S4: forming a plurality of third through-holes V3 by etching with a third mask plate, wherein the third through-holes V3 pass through the interlayer insulating layer 144, the first gate insulating layer 143, and the second gate insulating layer 142, and a bottom surface of the first through-holes V3 is in contact with the active layer 1411, thereby exposing a portion of the active layer 1411, as shown in FIG. 3C;

Step S5: forming a flexible layer 16 on a surface of a side of the substrate 11 away from the interlayer insulating layer 144, wherein a flexible material of the flexible layer 16 is filled in the first through-holes V1 and the second through-holes V2, as shown in FIG. 2;

Step S6: forming a source/drain electrode layer 1414 and a plurality of data lines L on the flexible layer 16, wherein the source/drain electrode layer 1414 is in connected to the active layer 1411 by the third through-holes; and Step S7: forming a planarization layer 17, a pixel defining layer 18, a display device layer 15, and a plurality of spacers 19 on a side of the flexible layer 16 away from the substrate 11, wherein a structure of the display device layer 15 and the structure of the above-mentioned display device layer are same, and is not described here again.

In the step S2, the first areas V21 of the second through-holes V2 and the first parts V11 of the first through-holes V11 can be simultaneously formed with the first mask plate. In addition, in the step S3, the second areas V22 of the second through-holes V22 and the second parts V12 of the first through-holes V1 can be simultaneously formed with the second mask plate. As a result, relevant manufacturing processes of the first through-holes V1 can be reduced, and the number of masks for manufacturing the first through-holes can be reduced. Furthermore, a production yield rate can be improved, production costs can be reduced, and a portion of an organic insulating material of the buffer layer 13 and a portion of an organic insulating material of the buffer layer 12 can be omitted because of the second parts V12 passing through the buffer layer 13 and the barrier layer 12. Thus, bending resistance capability of the display area A of the display panel can be improved.

Furthermore, as shown in FIG. 3C, a diameter of the first parts V11 of the first through-holes V1 is greater than a diameter of the second parts V12 of the first through-holes V1. A step-shaped buffer angle is formed at the buffer layer 13 where the first part V11 and the second part V12 are connected, thereby reducing slope of the first through-holes V1 and decreasing applied forces generated when the display area A is bent.

Furthermore, the diameter of the first parts V11 and the diameter of the second parts V12 of the first through-holes V1 are progressively decreased along a direction from the interlayer insulating layer 144 to the substrate 11. That is, a schematic structural view of the first part V11 and a schematic structural view of the second part V12 shown in FIG. 1 are inverted trapezoidal. An angle between a side wall of the first part V11 and a first direction and an angle between a side wall of the second part V12 and the first direction are an acute angle. Wherein, the first direction is a horizontal direction perpendicular to the thickness direction of the display panel.

Preferably, the angle between the side wall of the first part V11 and the first direction and the angle between the side wall of the second part V12 and the first direction range from 40° to 80°. If the angle is too wide, the slope of the first through-holes V1 will to be too steep, which is not beneficial for reducing applied forces generated when the display area is bent. On the other hand, if the angle is too narrow, an opening area of the first through-holes V1 will be too large, which is not beneficial for increasing an opening area of pixels.

Figure 4:
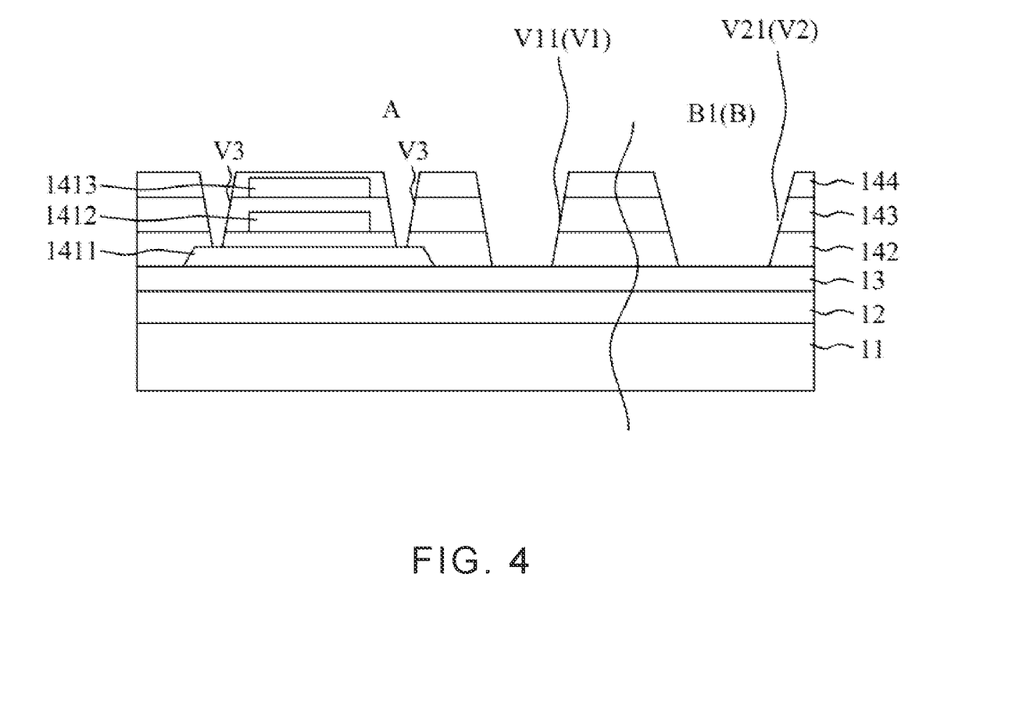
FIG. 4 is a sectional structural schematic view showing another display panel manufactured by a manufacturing method provided by an embodiment of the present disclosure taken along the C-C direction in FIG. 1.

An embodiment of the present disclosure further provides a method of manufacturing another display panel, which is illustrated in detail below in conjunction with FIG. 3C to FIG. 4. FIG. 4 shows a sectional structural schematic view of another display panel manufacturing by the manufacturing method provided by the embodiment of the present disclosure taken along the C-C direction in FIG. 1. The manufacturing method of the display panel includes following steps:

Step S1: providing a substrate 11, and forming a barrier layer 12, a buffer layer 13, an active layer 1411, a first gate insulating layer 142, a first gate line layer 1412, a second gate insulating layer 143, a second gate line layer 1413, and an interlayer insulating layer 144 on the substrate 11, as shown in FIG. 4;

Step S2: forming a plurality of first parts V11 of a plurality of first through-holes V1, a plurality of first areas V11 of a plurality of second through-holes V2, and a plurality of third through-holes V3 by etching with a first mask plate, wherein the first parts V11 and the first areas V21 pass through the interlayer insulating layer 144, the first insulating layer 143, and the second insulating layer 142, and the third through-holes V3 pass through the first insulating layer 143 and the second insulating layer 142 to expose a portion of the active layer 1411, as shown in FIG. 4;

Step S3: forming a plurality of second parts V12 of the first through-holes V1 on the first parts V11 and a plurality of second areas V22 of the second through-holes V2 on the first areas V21 by etching with a second mask plate, wherein the second parts V12 and the second areas V22 pass through the buffer layer 13 and the barrier layer 12, as shown in FIG. 3B;

Step S4: forming a flexible layer 16 on a surface of a side of the substrate 11 away from the interlayer insulating layer 144, wherein a flexible material of the flexible layer 16 is filled in the first through-holes V1 and the second through-holes V2, as shown in FIG. 2;

Step S5: forming a source/drain electrode layer 1414 and a plurality of data lines L on the flexible layer 16, wherein the source/drain electrode layer 1414 is connected to the active layer 1411 by the third through-holes; and Step S6: forming a planarization layer 17, a pixel defining layer 18, a display device layer 15, and a plurality of spacers 19 on a side of the flexible layer 16 away from the substrate 11, wherein a structure of the display device layer 15 and the structure of the above-mentioned display device layer are same, and is not described here again.

Differences between the manufacturing methods provided by the above-mentioned embodiments and the manufacturing method provided by the present embodiment are: in the present embodiment, the manufacturing process of the first through-holes V3, the manufacturing process of the first part parts V11 of the first through-holes V1, and the manufacturing process of the first areas V21 of the second through-holes V2 are combined. The above three through-holes need to be formed by etching the interlayer insulating layer 144, the second gate insulating layer 143, and the first gate insulating layer 142. The active layer can stop the etching of the third through-holes V3. Therefore, the number of mask plates for forming the first through-holes V1 and the third through-holes V3 can be reduced, and relevant processes of manufacturing the first through-holes V1 and the third through-holes V3 can be simplified. Compared with the manufacturing methods provided by the above-mentioned embodiments, two mask plates and relevant processes can be saved in the present embodiment.

Regarding the beneficial effects: in the present embodiment, the first through-holes V1 and the second through-holes V2 are simultaneously formed, thereby reducing the number of mask plates for manufacturing the first through-holes V1 and simplifying relevant processes of the first through-holes V1. As a result, a production yield rate can be improved, and production costs can be reduced. Furthermore, an inorganic insulating material of the buffer layer 13 and an inorganic insulating material of the barrier layer 12 can be omitted due to the second parts V12 passing through the buffer layer 13 and the barrier layer 12, thereby improving bending resistance capability of the display area A of the display panel.

In summary, the present disclosure has been described with preferred embodiments thereof. The preferred embodiments are not intended to limit the present disclosure, and it is understood that many changes and modifications to the described embodiments can be carried out without departing from the scope and the spirit of the disclosure that is intended to be limited only by the appended claims.

What is claimed is:

1. A display panel, comprising a display area and a non-display area surrounding the display area, wherein the non-display area comprises a bonding area, and the display panel further comprises:
   a substrate;
   a barrier layer disposed on the substrate;
   a buffer layer disposed on a side of the barrier layer away from the substrate;
   a thin-film transistor (TFT) array layer disposed on a side of the buffer layer away from the substrate, wherein the TFT array layer comprises a plurality of TFTs and at least two insulating layers which are stacked and configured to separate a plurality of devices in the TFTs from each other; and
   a display device layer disposed on a side of the TFT array layer away from the substrate;
   wherein a plurality of first through-holes arranged apart from each other are defined in the display area, a plurality of second through-holes arranged apart from each other are defined in the bonding area, each of the first through-holes and the second through-holes runs through the insulating layers to a side of the substrate near the barrier layer, and the first through-holes and the second through-holes are filled with a flexible material.

2. The display panel of claim 1, wherein each of the second through-holes comprises a first area and a second area, a bottom surface of the second area is in contact with the side of the substrate near the barrier layer, and the first area and the second area are connected to each other at the side of the buffer layer away from the substrate.

3. The display panel of claim 2, wherein each of the first through-holes comprises a first part and a second part, the first part of each of the first through-holes and the first area of each of the second through-holes are defined on a same layer, and the second part of each of the first through-holes and the second area of each of the second through-holes are defined on a same layer.

4. The display panel of claim 3, wherein a diameter of the first part is greater than a diameter of the second part.

5. The display panel of claim 4, wherein the diameter of the first part and the diameter of the second part are progressively decreased along a direction from the insulating layer to the substrate.

6. The display panel of claim 1, wherein an angle between a side wall of each of the first through-holes and a first direction and an angle between a side wall of each of the second through-holes and the first direction range from 40° to 80°, and the first direction is perpendicular to a thickness direction of the display panel.

7. A display panel, comprising a display area and a non-display area surrounding the display area, wherein the non-display area comprises a bonding area, and the display panel further comprises:
   a substrate;
   a barrier layer disposed on the substrate;

a buffer layer disposed on a side of the barrier layer away from the substrate;

a TFT array layer disposed on a side of the buffer layer away from the substrate, wherein the TFT array layer comprises a plurality of TFTs and at least two insulating layers which are stacked and configured to separate a plurality of devices in the TFTs from each other;

a display device layer disposed on a side of the TFT array layer away from the substrate; and a flexible layer disposed between the TFT array layer and the display device layer;

wherein a plurality of first through-holes arranged apart from each other are defined in the display area, a plurality of second through-holes arranged apart from each other are defined in the bonding area, each of the first through-holes and the second through-holes runs through the insulating layers to a side of the substrate near the barrier layer, each of the second through-holes comprises a first area and a second area, a bottom surface of the second area is in contact with the side of the substrate near the barrier layer, the first area and the second area are connected to each other at the side of the buffer layer away from the substrate, each of the first through-holes comprises a first part defined on a same layer as the first area and a second part defined on a same layer as the second area, and the first through-holes and the second through-holes are filled with a flexible material of the flexible layer.

8. The display panel of claim 7, wherein a diameter of the first part is greater than a diameter of the second part.

9. The display panel of claim 8, wherein the diameter of the first part and the diameter of the second part are progressively decreased along a direction from the insulating layer to the substrate.

10. The display panel of claim 7, wherein an angle between a side wall of each of the first through-holes and a first direction and an angle between a side wall of each of the second through-holes and the first direction range from 40° to 80°, and the first direction is perpendicular to a thickness direction of the display panel.

11. A method of manufacturing a display panel, comprising following steps:

providing a substrate, and forming a barrier layer, a buffer layer, an active layer, a gate insulating layer, a gate line layer, and an interlayer insulating layer on the substrate;

etching the interlayer insulating layer and the gate insulating layer to form a plurality of first parts of a plurality of first through-holes and a plurality of first areas of a plurality of second through-holes with a first mask plate, wherein the first parts and the first areas pass through the interlayer insulating layer and the gate insulating layer;

etching the first parts and the first areas to form a plurality of second parts of the first through-holes and a plurality of second areas of the second through-holes with a second mask plate, wherein the second parts and the second areas pass through the buffer layer and the barrier layer; and forming a flexible layer on a surface of the interlayer insulating layer, and filling a flexible material in the first through-holes and the second through-holes;

wherein the substrate comprises a display area and a non-display area surrounding the display area, the non-display area comprises a bonding area, the first through-holes are arranged apart from each other in the display area, and the second through-holes area arranged apart from each other in the bonding area.

12. The method of claim 11, wherein when the first parts and the first areas are formed by etching with the first mask plate, a plurality of third through-holes passing through the interlayer insulating layer and the gate insulating layer are formed to expose a portion of the active layer.

13. The method of claim 11, wherein a diameter of the first parts is greater than a diameter of the second parts.

14. The method of claim 13, wherein an angle between a side wall of each of the first parts and a first direction and an angle between a side wall of each of the second parts and the first direction range from 40° to 80°, and the first direction is perpendicular to a thickness direction of the display panel.

* * * * *